(12) United States Patent
Doczy et al.

(10) Patent No.: US 7,390,709 B2
(45) Date of Patent: Jun. 24, 2008

(54) METHOD FOR MAKING A SEMICONDUCTOR DEVICE HAVING A HIGH-K GATE DIELECTRIC LAYER AND A METAL GATE ELECTRODE

(75) Inventors: Mark L. Doczy, Beaverton, OR (US);
Justin K. Brask, Portland, OR (US);
Jack Kavalieros, Portland, OR (US);
Uday Shah, Portland, OR (US);
Matthew V. Metz, Hillsboro, OR (US);
Suman Datta, Beaverton, OR (US);
Ramune Nagisetty, Portland, OR (US);
Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 388 days.

(21) Appl. No.: 10/937,195

(22) Filed: Sep. 8, 2004

(65) Prior Publication Data

US 2006/0051924 A1   Mar. 9, 2006

(51) Int. Cl.
*H01L 21/8238* (2006.01)
(52) U.S. Cl. .................. 438/199; 438/591; 438/785; 257/E27.064
(58) Field of Classification Search ................ 438/199, 438/240, 785, 591
See application file for complete search history.

(56) References Cited

U.S. PATENT DOCUMENTS

| 6,063,698 | A | 5/2000 | Tseng et al. | 438/585 |
|---|---|---|---|---|
| 6,083,836 | A | 7/2000 | Rodder | 438/690 |
| 6,184,072 | B1 | 2/2001 | Kaushik et al. | 438/197 |
| 6,255,698 | B1 | 7/2001 | Gardner et al. | 257/369 |
| 6,335,534 | B1 * | 1/2002 | Suguro et al. | 250/492.21 |
| 6,365,450 | B1 | 4/2002 | Kim | 438/216 |
| 6,410,376 | B1 | 6/2002 | Ng et al. | 438/199 |
| 6,420,279 | B1 | 7/2002 | Ono et al. | 438/785 |
| 6,475,874 | B2 | 11/2002 | Xiang et al. | 438/396 |
| 6,514,828 | B2 | 2/2003 | Ahn et al. | 438/240 |

(Continued)

FOREIGN PATENT DOCUMENTS

EP   0 899 784 AZ   3/1999

(Continued)

OTHER PUBLICATIONS

Polishchuk et al., "Dual Workfunction CMOS Gate Technology Based on Metal Interdiffusion", www.eesc.berkeley.edu, 1 page.

(Continued)

*Primary Examiner*—Thanh Nguyen
(74) *Attorney, Agent, or Firm*—Kenneth A. Nelsonon; Intel Corporation (57) ABSTRACT

A method for making a semiconductor device is described. That method comprises forming a first dielectric layer on a substrate, a trench within the first dielectric layer, and a second dielectric layer on the substrate. The second dielectric layer has a first part that is formed in the trench and a second part. After a first metal layer with a first workfunction is formed on the first and second parts of the second dielectric layer, part of the first metal layer is converted into a second metal layer with a second workfunction.

15 Claims, 7 Drawing Sheets

U.S. PATENT DOCUMENTS

| | | | |
|---|---|---|---|
| 6,544,906 B2 | 4/2003 | Rotondaro et al. | 438/785 |
| 6,559,462 B1* | 5/2003 | Carpenter et al. | 250/492.21 |
| 6,586,288 B2 | 7/2003 | Kim et al. | 438/183 |
| 6,617,209 B1 | 9/2003 | Chau et al. | 438/240 |
| 6,617,210 B1 | 9/2003 | Chau et al. | 438/240 |
| 6,620,713 B2 | 9/2003 | Arghavani et al. | 438/585 |
| 6,642,131 B2 | 11/2003 | Harada | 438/591 |
| 6,667,246 B2 | 12/2003 | Mitsuhashi et al. | 438/756 |
| 6,689,675 B1 | 2/2004 | Parker et al. | 438/585 |
| 6,696,327 B1 | 2/2004 | Brask et al. | 438/197 |
| 6,696,345 B2 | 2/2004 | Chau et al. | 438/387 |
| 6,709,911 B1 | 2/2004 | Doczy et al. | 438/197 |
| 6,716,707 B1 | 4/2004 | Brask et al. | 438/287 |
| 6,727,130 B2 | 4/2004 | Kim et al. | 438/199 |
| 6,746,967 B2 | 6/2004 | Brask et al. | 438/752 |
| 6,770,568 B2 | 8/2004 | Brask | 438/746 |
| 6,794,234 B2 | 9/2004 | Polishchuk et al. | 438/199 |
| 2002/0058374 A1 | 5/2002 | Kim et al. | 438/228 |
| 2002/0086504 A1 | 7/2002 | Park et al. | 438/580 |
| 2002/0197790 A1 | 12/2002 | Kizilyalli et al. | 438/240 |
| 2003/0032303 A1 | 2/2003 | Yu et al. | 438/770 |
| 2003/0045080 A1 | 3/2003 | Visokay et al. | 438/591 |
| 2004/0005749 A1* | 1/2004 | Choi et al. | 438/197 |
| 2004/0087070 A1 | 5/2004 | Nakajima | 438/197 |
| 2005/0110098 A1* | 5/2005 | Yoshihara | 257/371 |
| 2005/0253173 A1* | 11/2005 | Wang et al. | 257/282 |

FOREIGN PATENT DOCUMENTS

| | | |
|---|---|---|
| EP | 1 032 033 A3 | 8/2000 |
| GB | 2 358 737 A | 4/2001 |
| JP | 2002118175 | 4/2002 |
| JP | 2002299610 | 10/2002 |
| WO | WO 03/079444 A1 | 9/2003 |

OTHER PUBLICATIONS

Doug Barlage et al., "High-Frequency Response of 100nm Integrated CMOS Transistors with High-K Gate Dielectrics", 2001 IEEE, 4 pages.

Lu et al., "Dual-Metal Gate Technology for Deep-Submicron CMOS Devices", dated Apr. 29, 2003, 1 page.

Schwantes et al., "Performance Improvement of Metal Gate CMOS Technologies with Gigabit Feature Sizes", Technical University of Hanburg-Hanburg, 5 pages.

Brask et al., "A Method for Making a Semiconductor Device Having a High-K Gate Dielectric Layer and A Metal Gate Electrode", U.S. Appl. No. 10/828,958, filed Apr. 20, 2004.

Metz et al. "A Method For Making A Semiconductor Device Having A High-K Gate Dielectric Layer and A Metal Gate Electrode" U.S. Appl. No. 10/839,077, filed May 4, 2004.

* cited by examiner

METHOD FOR MAKING A SEMICONDUCTOR DEVICE HAVING A HIGH-K GATE DIELECTRIC LAYER AND A METAL GATE ELECTRODE

FIELD OF THE INVENTION

The present invention relates to methods for making semiconductor devices, in particular, semiconductor devices that include metal gate electrodes.

BACKGROUND OF THE INVENTION

MOS field-effect transistors with very thin gate dielectrics made from silicon dioxide may experience unacceptable gate leakage currents. Forming the gate dielectric from certain high-k dielectric materials, instead of silicon dioxide, can reduce gate leakage. Because, however, such a dielectric may not be compatible with polysilicon, it may be desirable to use metal gate electrodes in devices that include high-k gate dielectrics.

When making a CMOS device that includes metal gate electrodes, a replacement gate process may be used to form gate electrodes from different metals. In one variant of that process, polysilicon layers are removed to create first and second trenches. Both trenches are filled with a first metal layer. The first metal layer is then removed from the first trench. A second metal layer is then deposited on the first metal layer in the second trench, and on the high-k gate dielectric in the first trench.

In this variant of the replacement gate process, the high-k gate dielectric—within the first trench—may serve as an etch stop, when the first metal layer is removed from the first trench. When the high-k gate dielectric performs an etch stop function, the process for etching the first metal layer may damage the underlying dielectric, which may adversely affect the performance and reliability of transistors that include the high-k gate dielectric.

Accordingly, there is a need for an improved process for making a semiconductor device that includes a high-k gate dielectric and a metal gate electrode. There is a need for a replacement gate process for making such a device that does not require the high-k gate dielectric to serve as an etch stop, when removing a metal layer from its surface. The method of the present invention provides such a process.

BRIEF DESCRIPTION OF THE DRAWINGS

Features shown in these figures are not intended to be drawn to scale.

DETAILED DESCRIPTION OF THE PRESENT INVENTION

A method for making a semiconductor device is described. That method comprises forming a first dielectric layer on a substrate, forming a trench within the first dielectric layer, and forming a second dielectric layer on the substrate. The second dielectric layer has a first part that is formed at the bottom of the trench and a second part. A first metal layer with a first workfunction is formed on the first part of the second dielectric layer and on the second part of the second dielectric layer. The first metal layer, where formed on the first part of the second dielectric layer, is then converted into a second metal layer with a second workfunction.

In the following description, a number of details are set forth to provide a thorough understanding of the present invention. It will be apparent to those skilled in the art, however, that the invention may be practiced in many ways other than those expressly described here. The invention is thus not limited by the specific details disclosed below.

Figure 1A:
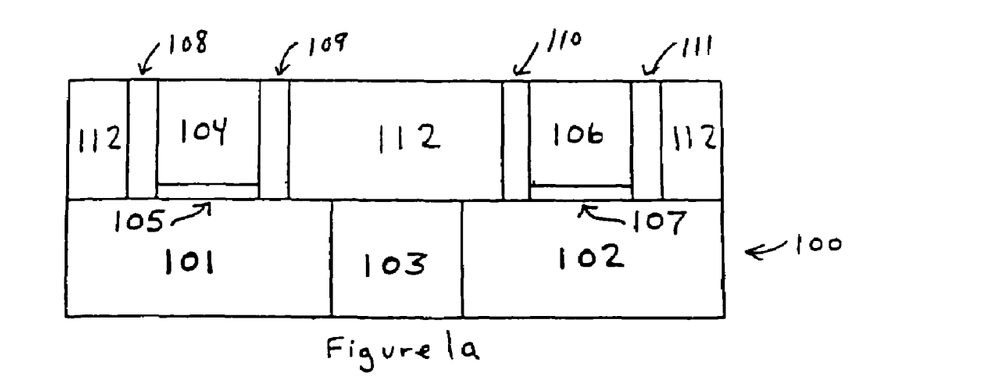
FIGS. 1a-1i represent cross-sections of structures that may be formed when carrying out an embodiment of the method of the present invention.

FIGS. 1a-1i illustrate structures that may be formed, when carrying out an embodiment of the method of the present invention. FIG. 1a represents an intermediate structure that may be formed when making a CMOS device. That structure includes first part 101 and second part 102 of substrate 100. Isolation region 103 separates first part 101 from second part 102. Polysilicon layers 104 and 106 are formed on dummy dielectric layers 105 and 107, respectively. Polysilicon layers 104 and 106 lie between sidewall spacers 108 and 109, and sidewall spacers 110 and 111, respectively. First dielectric layer 112 separates the sidewall spacers.

Substrate 100 may comprise any material that may serve as a foundation upon which a semiconductor device may be built. Isolation region 103 may comprise silicon dioxide, or other materials that may separate the transistor's active regions. Dummy dielectric layers 105 and 107 may each comprise silicon dioxide, or other materials that may insulate the substrate from other substances. First and second polysilicon layers 104 and 106 preferably are each between about 100 and about 2,000 angstroms thick, and more preferably are between about 500 and about 1,600 angstroms thick. Those layers each may be undoped or doped with similar substances. Alternatively, one layer may be doped, while the other is not doped, or one layer may be doped n-type (e.g., with arsenic, phosphorus or another n-type material), while the other is doped p-type (e.g., with boron or another p-type material). Spacers 108, 109, 110, 111 preferably comprise silicon nitride, while first dielectric layer 112 may comprise silicon dioxide, or a low-k material.

Conventional process steps, materials, and equipment may be used to generate the FIG. 1a structure, as will be apparent to those skilled in the art. As shown, first dielectric layer 112 may be polished back, e.g., via a conventional chemical mechanical polishing ("CMP") operation, to expose first and second polysilicon layers 104 and 106. Although not shown, the FIG. 1a structure may include many other features (e.g., a silicon nitride etch stop layer, source and drain regions, and one or more buffer layers) that may be formed using conventional processes.

After forming the FIG. 1a structure, first and second polysilicon layers 104 and 106 are removed. In a preferred embodiment, those layers are removed by applying a wet etch process, or processes. Such a wet etch process may comprise exposing layers 104 and 106 to an aqueous solution that comprises a source of hydroxide for a sufficient time at a sufficient temperature to remove substantially all of those layers. That source of hydroxide may comprise between about 2 and about 30 percent ammonium hydroxide or a tetraalkyl ammonium hydroxide, e.g., tetramethyl ammonium hydroxide ("TMAH"), by volume in deionized water.

An n-type polysilicon layer may be removed by exposing it to a solution, which is maintained at a temperature between about 15° C. and about 90° C. (and preferably below about 40° C.), that comprises between about 2 and about 30 percent ammonium hydroxide by volume in deionized water. During that exposure step, which preferably lasts at least one minute, it may be desirable to apply sonic energy at a frequency of between about 10 KHz and about 2,000 KHz, while dissipating at between about 1 and about 10 watts/cm². For example, an n-type polysilicon layer that is about 1,350 angstroms thick may be removed by exposing it at about 25° C. for about 30 minutes to a solution that comprises about 15 percent ammonium hydroxide by volume in deionized water, while applying sonic energy at about 1,000 KHz—dissipating at about 5 watts/cm².

As an alternative, an n-type polysilicon layer may be removed by exposing it for at least one minute to a solution, which is maintained at a temperature between about 60° C. and about 90° C., that comprises between about 20 and about 30 percent TMAH by volume in deionized water, while applying sonic energy. Substantially all of such an n-type polysilicon layer that is about 1,350 angstroms thick may be removed by exposing it at about 80° C. for about 2 minutes to a solution that comprises about 25 percent TMAH by volume in deionized water, while applying sonic energy at about 1,000 KHz—dissipating at about 5 watts/cm².

A p-type polysilicon layer may also be removed by exposing it to a solution that comprises between about 20 and about 30 percent TMAH by volume in deionized water for a sufficient time at a sufficient temperature (e.g., between about 60° C. and about 90° C.), while applying sonic energy. Those skilled in the art will recognize that the particular wet etch process, or processes, that should be used to remove first and second polysilicon layers 104 and 106 will vary, depending upon whether none, one or both of those layers are doped, e.g., one layer is doped n-type and the other p-type.

For example, if layer 104 is doped n-type and layer 106 is doped p-type, it may be desirable to first apply an ammonium hydroxide based wet etch process to remove the n-type layer followed by applying a TMAH based wet etch process to remove the p-type layer. Alternatively, it may be desirable to simultaneously remove layers 104 and 106 with an appropriate TMAH based wet etch process.

Figure 1B:
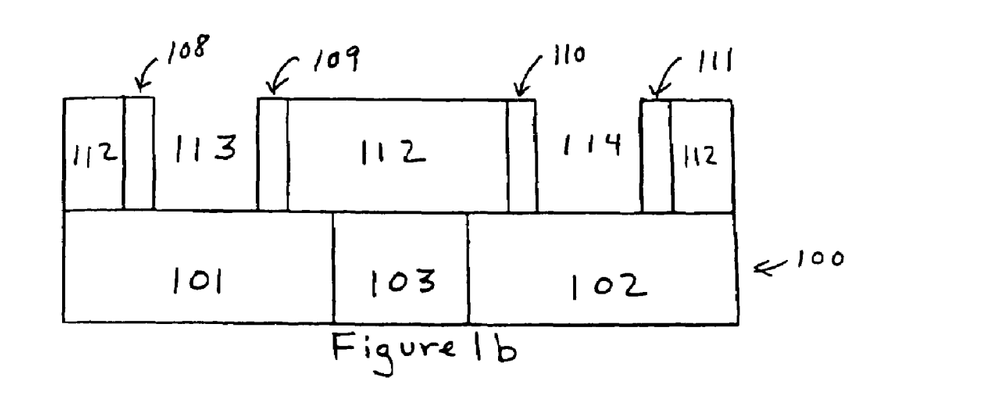

After removing first and second polysilicon layers 104 and 106, dummy dielectric layers 105 and 107 are exposed. In this embodiment, dummy layers 105 and 107 are removed. When dummy dielectric layers 105 and 107 comprise silicon dioxide, they may be removed using an etch process that is selective for silicon dioxide. Such an etch process may comprise exposing layers 105 and 107 to a solution that includes about 1 percent HF in deionized water. The time layers 105 and 107 are exposed should be limited, as the etch process for removing those layers may also remove part of first dielectric layer 112. With that in mind, if a 1 percent HF based solution is used to remove layers 105 and 107, the device preferably should be exposed to that solution for less than about 60 seconds, and more preferably for about 30 seconds or less. As shown in FIG. 1b, removal of dummy dielectric layers 105 and 107 leaves first and second trenches 113 and 114 within first dielectric layer 112 positioned between sidewall spacers 108 and 109, and sidewall spacers 110 and 111, respectively.

In this embodiment, after removing dummy dielectric layers 105 and 107, second dielectric layer 115 is formed on substrate 100. Second dielectric layer 115 has first part 130 that is formed at the bottom of first trench 113, and second part 131—which in this embodiment is formed at the bottom of second trench 114. Preferably, second dielectric layer 115 comprises a high-k gate dielectric layer. Some of the materials that may be used to make such a high-k gate dielectric layer include: hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, zirconium oxide, and aluminum oxide. Although a few examples of materials that may be used to form a high-k gate dielectric layer are described here, that layer may be made from other materials.

High-k gate dielectric layer 115 may be formed on substrate 100 using a conventional deposition method, e.g., a conventional chemical vapor deposition ("CVD"), low pressure CVD, or physical vapor deposition ("PVD") process. Preferably, a conventional atomic layer CVD process is used. In such a process, a metal oxide precursor (e.g., a metal chloride) and steam may be fed at selected flow rates into a CVD reactor, which is then operated at a selected temperature and pressure to generate an atomically smooth interface between substrate 100 and high-k gate dielectric layer 115. The CVD reactor should be operated long enough to form a layer with the desired thickness. In most applications, high-k gate dielectric layer 115 should be less than about 60 angstroms thick, and more preferably between about 5 angstroms and about 40 angstroms thick.

Figure 1C:
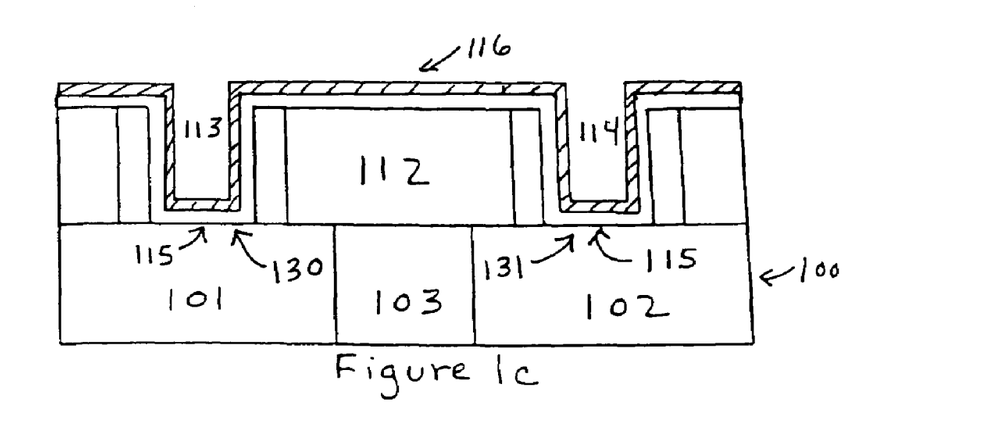

As shown in FIG. 1c, when an atomic layer CVD process is used to form high-k gate dielectric layer 115, that layer will form on the sides of trenches 113 and 114 in addition to forming on the bottom of those trenches. If high-k gate dielectric layer 115 comprises an oxide, it may manifest oxygen vacancies at random surface sites and unacceptable impurity levels, depending upon the process used to make it. It may be desirable to remove impurities from layer 115, and to oxidize it to generate a layer with a nearly idealized metal:oxygen stoichiometry, after layer 115 is deposited.

To remove impurities from that layer and to increase that layer's oxygen content, a wet chemical treatment may be applied to high-k gate dielectric layer 115. Such a wet chemical treatment may comprise exposing high-k gate dielectric layer 115 to a solution that comprises hydrogen peroxide at a sufficient temperature for a sufficient time to remove impurities from high-k gate dielectric layer 115 and to increase the oxygen content of high-k gate dielectric layer 115. The appropriate time and temperature at which high-k gate dielectric layer 115 is exposed may depend upon the desired thickness and other properties for high-k gate dielectric layer 115.

When high-k gate dielectric layer 115 is exposed to a hydrogen peroxide based solution, an aqueous solution that contains between about 2% and about 30% hydrogen peroxide by volume may be used. That exposure step should take place at between about 15° C. and about 40° C. for at least about one minute. In a particularly preferred embodiment, high-k gate dielectric layer 115 is exposed to an aqueous solution that contains about 6.7% $H_2O_2$ by volume for about 10 minutes at a temperature of about 25° C. During that exposure step, it may be desirable to apply sonic energy at a frequency of between about 10 KHz and about 2,000 KHz, while dissipating at between about 1 and about 10 watts/cm². In a preferred embodiment, sonic energy may be applied at a frequency of about 1,000 KHz, while dissipating at about 5 watts/cm².

Although not shown in FIG. 1c, it may be desirable to form a capping layer, which is no more than about five monolayers thick, on high-k gate dielectric layer 115. Such a capping layer may be formed by sputtering one to five monolayers of silicon, or another material, onto the surface of high-k gate dielectric layer 115. The capping layer may then be oxidized, e.g., by using a plasma enhanced chemical vapor deposition process or a solution that contains an oxidizing agent, to form a capping dielectric oxide.

Although in some embodiments it may be desirable to form a capping layer on high-k gate dielectric layer 115, in the illustrated embodiment, first metal layer 116 is formed directly on layer 115 to generate the FIG. 1c structure. First metal layer 116 has a first workfunction and is formed on both first part 130 of high-k gate dielectric layer 115 and on second part 131 of high-k gate dielectric layer 115. First metal layer 116 may comprise any conductive material from which a metal gate electrode may be derived, and may be formed on high-k gate dielectric layer 115 using well known PVD or CVD processes.

Examples of n-type materials that may be used to form first metal layer 116 include: hafnium, zirconium, titanium, tantalum, aluminum, and metal carbides that include these elements, i.e., titanium carbide, zirconium carbide, tantalum carbide, hafnium carbide and aluminum carbide. If an n-type metal, first metal layer 116 may alternatively comprise an aluminide, e.g., an aluminide that comprises hafnium, zirconium, titanium, tantalum, or tungsten. Examples of p-type metals that may be used include: ruthenium, palladium, platinum, cobalt, nickel, and conductive metal oxides, e.g., ruthenium oxide. Although a few examples of materials that may be used to form first metal layer 116 are described here, that layer may be made from many other materials.

First metal layer 116 should be thick enough to ensure that any material formed on it will not significantly impact its workfunction. Preferably, first metal layer 116 is between about 25 angstroms and about 300 angstroms thick, and more preferably is between about 25 angstroms and about 200 angstroms thick. When first metal layer 116 comprises an n-type material, layer 116 preferably has a workfunction that is between about 3.9 eV and about 4.2 eV. When first metal layer 116 comprises a p-type material, layer 116 preferably has a workfunction that is between about 4.9 eV and about 5.2 eV.

In a preferred embodiment, first metal layer 116 has a first workfunction that is suitable for forming a first type of gate electrode, e.g., NMOS or PMOS, but not suitable for forming a second type of gate electrode. If, for example, first metal layer 116 has a first workfunction that is suitable for forming an NMOS gate electrode, then part of first metal layer 116 must be converted into a second metal layer that has a second workfunction that is suitable for forming a PMOS gate electrode. Similarly, if first metal layer 116 has a first workfunction that is suitable for forming a PMOS gate electrode, then part of first metal layer 116 must be converted into a second metal layer that has a second workfunction that is suitable for forming an NMOS gate electrode.

In the illustrated embodiment, first metal layer 116, where formed on first part 130 of high-k gate dielectric layer 115, is converted into a second metal layer with a second workfunction. Part of first metal layer 116 may be converted into a second metal layer with a second workfunction by adding to it a workfunction shifting component. A workfunction shifting component may, for example, be added to part of first metal layer 116 by masking part of first metal layer 116, then adding the workfunction shifting component to the unmasked part of first metal layer 116. Examples of processes for adding such a workfunction shifting component to an unmasked part of first metal layer 116 include ion implantation, plasma enhanced ion implantation, furnace diffusion, and plasma deposition.

In addition, a workfunction shifting component may be added to first metal layer 116 by depositing a donor metal layer on first metal layer 116, removing that layer where first metal layer 116 should not be modified, then inducing the workfunction shifting component to diffuse from the donor metal layer into first metal layer 116. In one embodiment, after such a donor metal layer is deposited onto first metal layer 116, a first part of the donor metal layer is masked, and the unmasked second part of the donor metal layer is removed, prior to causing the workfunction shifting component to diffuse from the donor metal layer into first metal layer 116. Alternatively, a masking layer may be formed on part of first metal layer 116, the donor metal layer may be deposited onto the exposed part of first metal layer 116 and on the masking layer, and the masking layer may be removed—along with the part of the donor metal layer that was deposited on it—prior to causing the workfunction shifting component to diffuse from the donor metal layer into first metal layer 116.

Figure 1D:
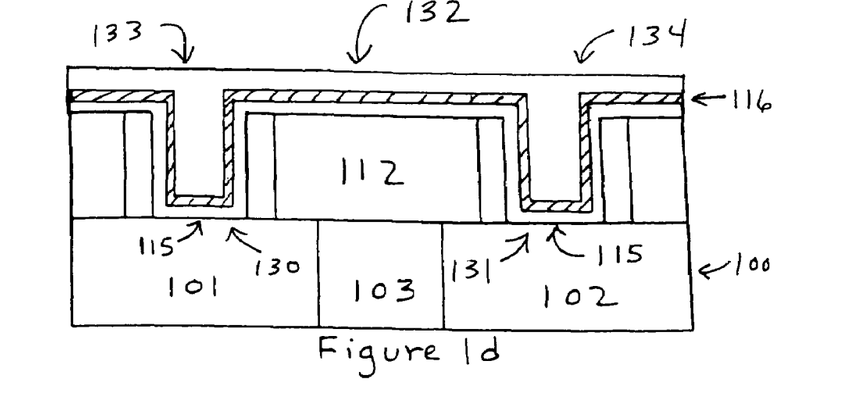

FIGS. 1d-1i illustrate an embodiment of the present invention in which part of first metal layer 116 is masked after first metal layer 116 is formed on high-k gate dielectric layer 115, and the exposed part of first metal layer 116 is then converted into a second metal layer with a second workfunction. To mask first metal layer 116, e.g., where formed on second part 131 of high-k gate dielectric layer 115, initially masking layer 132 may be formed on first metal layer 116, as shown in FIG. 1d.

Figure 1E:
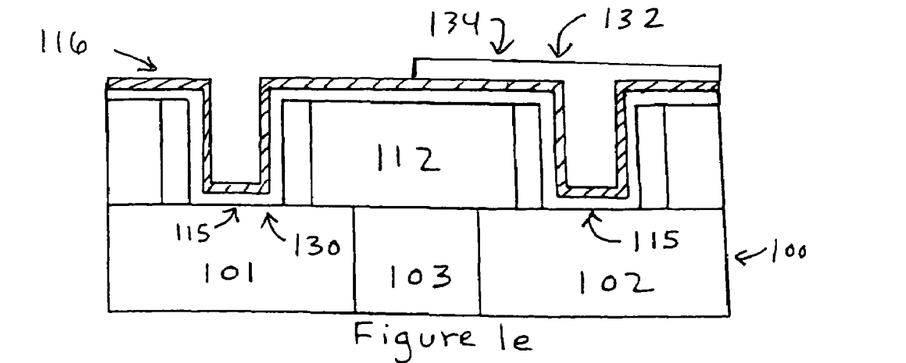

In a preferred embodiment, masking layer 132 comprises sacrificial light absorbing material ("SLAM") 132, which may be spun onto first metal layer 116. First part 133 of SLAM 132 covers first part 130 of high-k gate dielectric layer 115, and second part 134 of SLAM 132 covers second part 131 of high-k gate dielectric layer 115. After depositing SLAM 132 on first metal layer 116, first part 133 of SLAM 132 is removed while second part 134 of SLAM 132 is retained. First part 133 of SLAM 132 may be removed in the following way. First, a layer of photoresist (not shown) is deposited on SLAM 132, then patterned such that it covers only second part 134 of SLAM 132. Exposed part 133 may then be removed, e.g., by applying an appropriate wet etch process. After removing part 133 of SLAM 132, the patterned photoresist layer may be removed. As a result, first metal layer 116 is exposed where formed on first part 130 of high-k gate dielectric layer 115, as FIG. 1e illustrates.

SLAM 132 may comprise, for example, a spin on glass ("SOG") layer or a spin on polymer ("SOP") layer, which includes a light absorbing dye. That light absorbing dye preferably absorbs light at the wavelength used to pattern an overlying photoresist layer. In addition, SLAM 132 (whether an SOG or SOP) should completely and uniformly fill trenches 113 and 114, and should have wet etch properties that enable it to be removed selectively to first metal layer 116.

Figure 1F:
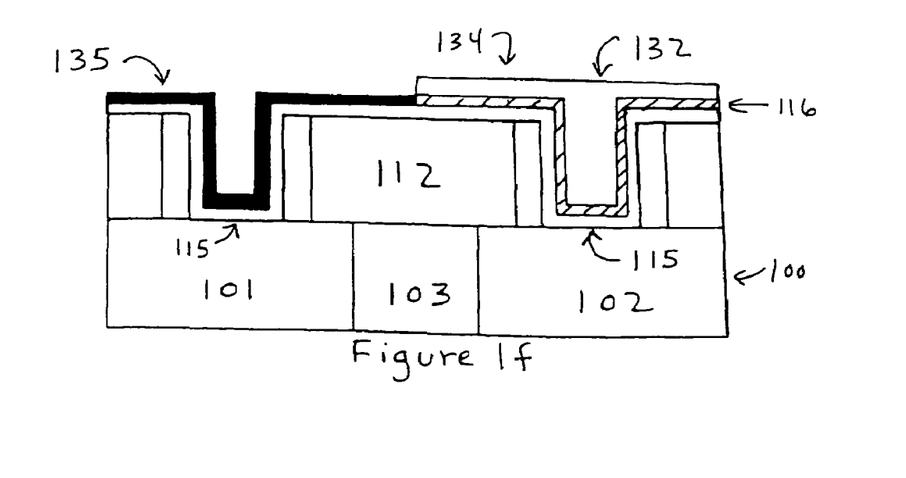
Figure 1G:
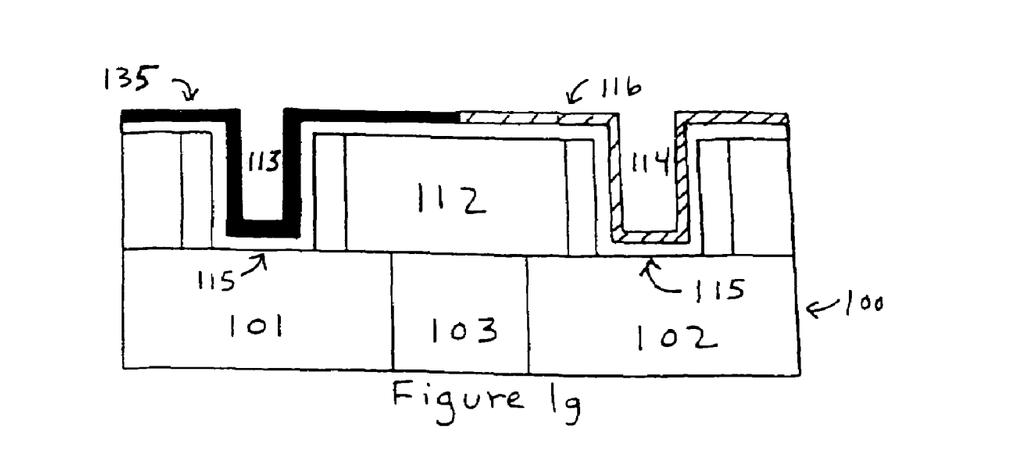
Figure 1H:
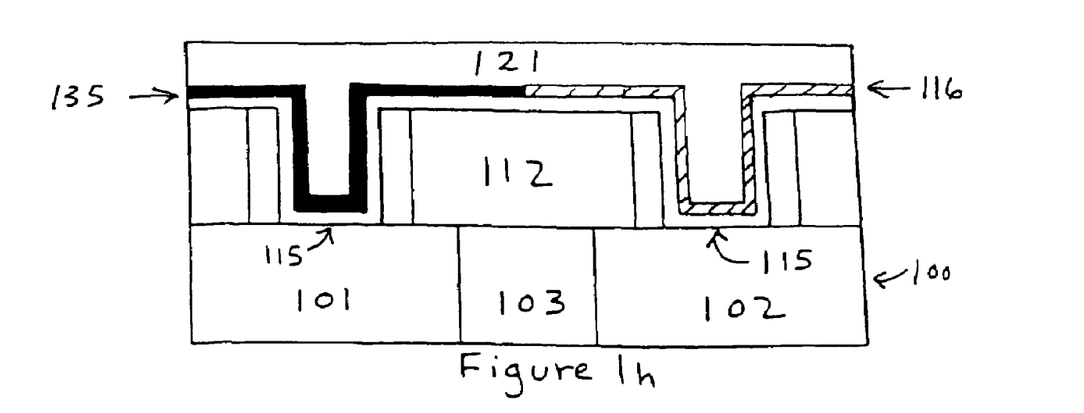

After removing SLAM 132, where it had covered first part 130 of high-k gate dielectric layer 115, first metal layer 116 (where formed on first part 130 of high-k gate dielectric layer 115) is converted into second metal layer 135, as figure 1f illustrates. As indicated above, the exposed part of first metal layer 116 may be converted into second metal layer 135 in multiple ways—e.g., by adding a workfunction shifting component to the unmasked part of first metal layer 116 via an appropriate ion implantation, plasma enhanced ion implantation, furnace diffusion, or plasma deposition process. Alternatively, a donor metal layer may be deposited onto the exposed part of first metal layer 116 and on SLAM 132, after which SLAM 132 is removed (along with the part of the donor metal layer that was deposited on it) followed by causing a workfunction shifting component to diffuse from the donor metal layer into the exposed part of first metal layer 116.

In a preferred embodiment, the exposed part of first metal layer 116 is exposed to a plasma that is derived at least in part from a workfunction shifting component. If first metal layer 116 comprises an n-type metal, then the workfunction shifting component preferably comprises an element with relatively high electronegativity, e.g., an electronegativity value that is greater than about 2.8. If first metal layer 116 comprises a p-type metal, then the workfunction shifting component preferably comprises an element with relatively low electronegativity, e.g., an electronegativity value that is less than about 1.7.

Figure 2:
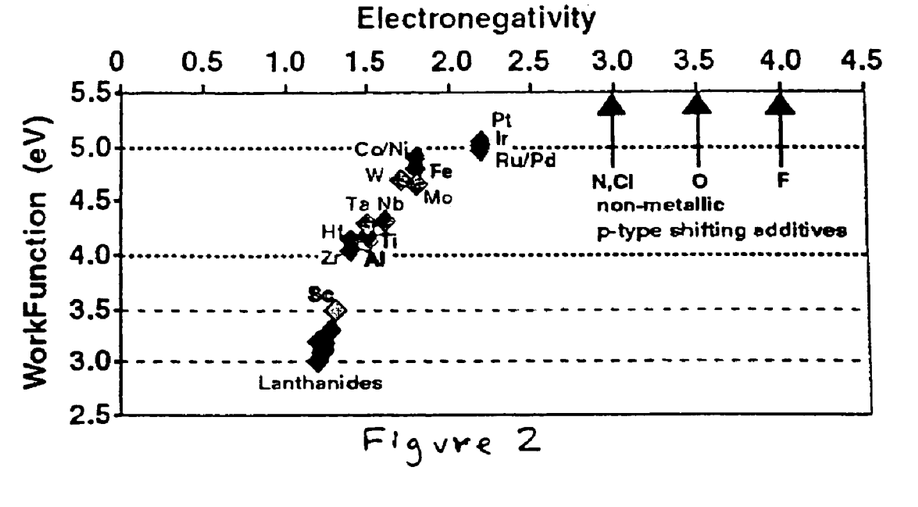
FIG. 2 provides a chart showing how various elements' workfunctions scale with their electronegativity.

FIG. 2 provides a chart showing how a material's workfunction scales with electronegativity. Adding to the exposed part of first metal layer 116 a significant quantity of a material with a relatively high electronegativity may raise the workfunction of that part of first metal layer 116. Adding to first metal layer 116 a significant quantity of a material with a relatively low electronegativity may lower the workfunction of first metal layer 116.

As is apparent from that chart, elements that may increase the workfunction of an n-type metal layer, rendering it potentially suitable for forming a PMOS gate electrode, include: nitrogen, chlorine, oxygen, fluorine, and bromine. Fluorine may be a particularly preferred element for raising the workfunction of an n-type metal layer. Elements that may reduce the workfunction of a p-type metal layer, rendering it potentially suitable for forming an NMOS gate electrode, include: lanthanide metals, scandium, zirconium, hafnium, aluminum, titanium, tantalum, niobium, and tungsten. Other potentially useful elements include the alkali metals and alkaline earth metals. Aluminum and cerium may be particularly preferred elements for reducing the workfunction of a p-type metal layer.

The elements that best serve to raise or lower the workfunction of first metal layer 116 to the desired level may depend upon first metal layer 116's composition and properties. Although a few examples of the elements, which can shift first metal layer 116's workfunction, are identified here, other elements may be used instead. The process of the present invention thus contemplates the use of any element that may serve to convert the exposed part of first metal layer 116 into a second metal layer with a second workfunction. Whether it is best to add a single element to layer 116, or instead add multiple elements, may depend upon the particular application. The optimal concentration of the workfunction shifting component (or components) that is added to the exposed part of first metal layer 116 to shift its workfunction to the targeted level may also depend upon the composition and properties of layer 116 (including its initial workfunction), the type of workfunction shifting component used, and the target workfunction.

In a particularly preferred embodiment, first metal layer 116 comprises an n-type metal with a first workfunction that is between about 3.9 and about 4.2, and the exposed part of that n-type metal is converted into a second metal layer with a second workfunction that is between about 4.9 and about 5.2. Such an n-type metal layer may be converted into a second metal layer with a second workfunction by exposing that n-type metal layer to a fluorine based plasma.

That conversion may take place in an electron cyclotron resonance ("ECR") plasma reactor. A fluorine based plasma may be generated within such a reactor in the following way. Initially, a fluorine containing compound, e.g., sulfur hexafluoride ("$SF_6$"), is fed into the reactor, along with an inert gas, e.g., argon. A sufficient amount of that compound should be fed into the reactor to ensure that the desired conversion occurs. Next, the reactor should be operated under the appropriate conditions (e.g., temperature, pressure, radio frequency, and power), and for a sufficient time, to add enough fluorine to first metal layer 116 to create a second metal layer with a workfunction that is at least about 4.9 eV. It may be desirable to perform this operation at low power, e.g., at between about 100 watts and 150 watts.

It is believed that such a process will cause energetic fluorine ions to dissociate from the plasma and to react chemically with first metal layer 116 to create second metal layer 135. Because first metal layer 116 is relatively thin, it may be necessary to vary operating conditions for different types of metal layers, and for different thicknesses, to ensure that such a plasma deposition treatment does not sputter first metal layer 116. After converting the exposed part of first metal layer 116 into second metal layer 135, second part 134 of SLAM 132 may be removed to generate the structure of FIG. 1g. SLAM 132 may be removed using an appropriate wet etch process.

Although in this embodiment SLAM 132 is used to mask part of first metal layer 116, other conventional masking materials may be used instead. Applying a sacrificial light absorbing material as the masking material in the method of the present invention may, however, be beneficial for at least the following reasons. Such a sacrificial light absorbing material may fill narrow trenches that other materials, e.g., photoresist, may not adequately fill. In addition, conventional etch processes for removing various sacrificial light absorbing materials may effectively remove such materials without removing a significant part of the underlying metal layer.

Figure 1I:
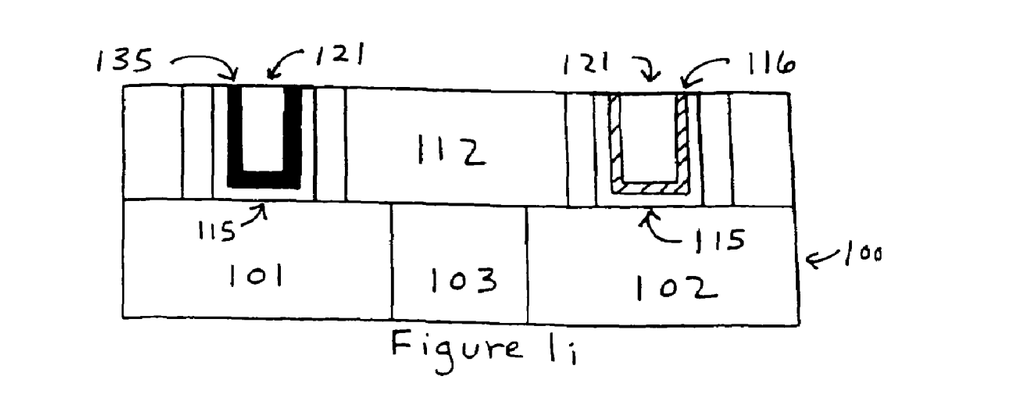

In this embodiment, after converting part of first metal layer 116 into second metal layer 135 (and removing SLAM 132), the remainder of trenches 113 and 114 may be filled with a material that may be easily polished, e.g., tungsten, aluminum, titanium, or titanium nitride. Such a trench fill metal, e.g., metal 121, may be deposited over the entire device using a conventional metal deposition process, generating the FIG. 1h structure. Fill metal 121, second metal layer 135, first metal layer 116, and high-k gate dielectric layer 115 may then be removed from the surface of first dielectric layer 112, e.g., via an appropriate CMP process, as shown in 1i.

In this embodiment second metal layer 135, first metal layer 116, and high-k gate dielectric layer 115 are removed from the surface of first dielectric layer 112 at the same time that fill metal 121 is removed from first dielectric layer 112. In other embodiments, second metal layer 135, first metal layer 116, and high-k gate dielectric layer 115 may be removed from the surface of first dielectric layer 112 before fill metal 121 is deposited on first metal layer 116 and second metal layer 135.

After removing trench fill metal 121, except where it fills trenches 113 and 114, a capping dielectric layer (not shown) may be deposited onto the resulting structure using any conventional deposition process. Process steps for completing the device that follow the deposition of such a capping dielectric layer, e.g., forming the device's contacts, metal interconnect, and passivation layer, are well known to those skilled in the art and will not be described here.

FIGS. 3a-3e represent cross-sections of structures that may be formed when carrying out the embodiment of FIGS. 1a-1i to generate a device that includes a P/N junction. Such a device may, for example, comprise an SRAM, which may be used in process development work. FIGS. 3a-3e represent structures that are oriented perpendicular to the plane of corresponding cross-sections represented in FIGS. 1a-1i. In this respect, FIGS. 3a-3e represent cross-sections that result when the device is rotated 90° from the position shown in FIGS. 1a-1i. FIGS. 3a-3e correspond to structures built within trench 113 that FIGS. 1a-1i illustrate.

Figure 3A:
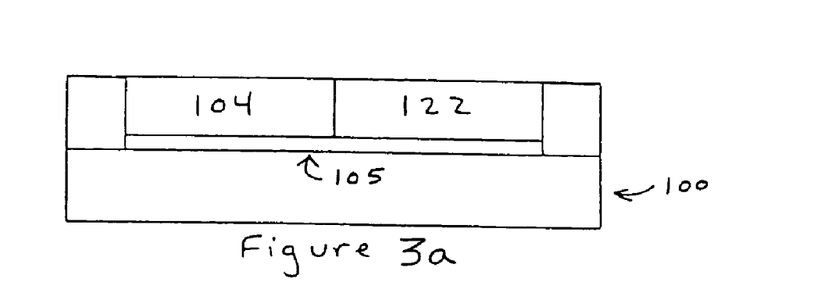
FIGS. 3a-3e represent cross-sections of structures that may be formed when carrying out the embodiment of FIGS. 1a-1i to generate a device that includes a P/N junction within a trench.
Figure 3B:
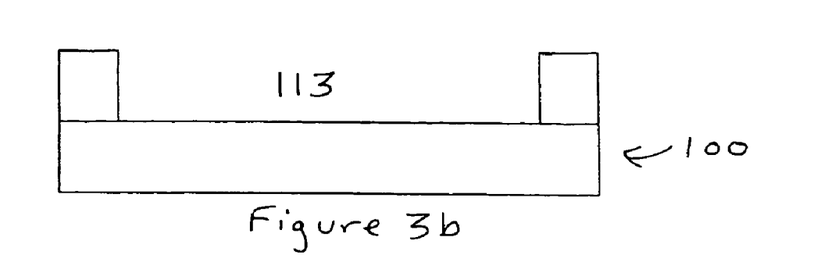
Figure 3C:
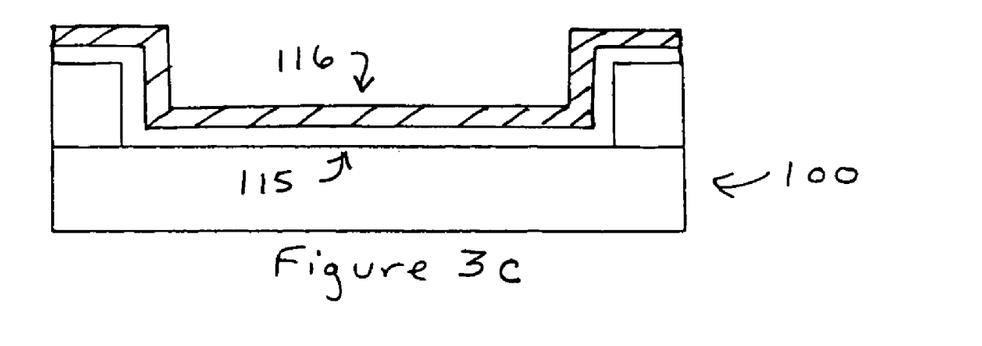

In this embodiment, FIG. 3a shows polysilicon layers 104 and 122 that are formed on dielectric layer 105, which is formed on substrate 100. This structure may be generated using materials and process steps described above. Although this embodiment illustrates two polysilicon layers, which may be doped differently, in alternative embodiments a single polysilicon layer may be formed on dielectric layer 105.

After forming the FIG. 3a structure, polysilicon layers 104 and 122, and dielectric layer 105, are removed, e.g., using process steps described above, to generate trench 113—as FIG. 3b illustrates. Trench 113 is then coated with high-k gate dielectric layer 115 and first metal layer 116 to generate the FIG. 3c structure. Because process steps and materials for forming those layers have been described previously, further recitation will not be presented here.

Figure 3D:
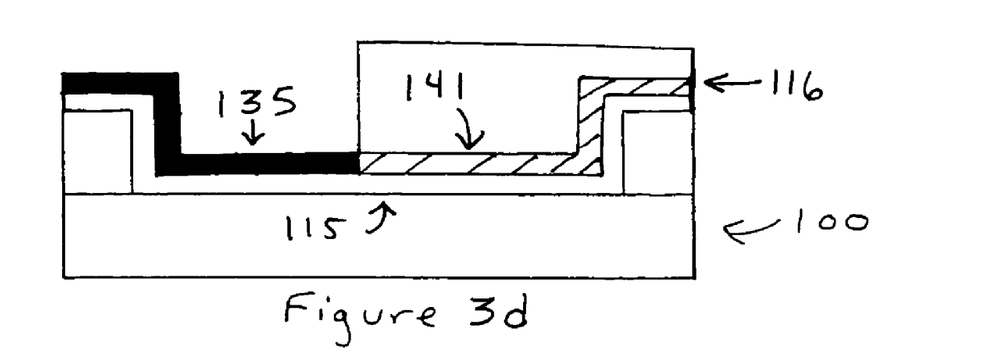
Figure 3E:
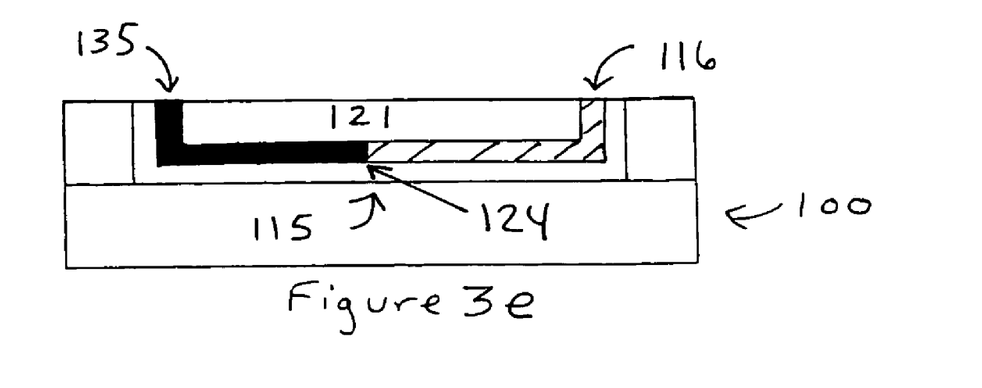

Part 141 of first metal layer 116 is then masked, and another part of that layer is converted into second metal layer 135, generating the structure of FIG. 3d. After removing the mask, the remainder of trench 113 is filled with a material (e.g., trench fill metal 121) that may be easily polished. That trench fill metal—along with underlying parts of second metal layer 135, first metal layer 116, and high-k gate dielectric layer 115—are then removed except where it fills trench 113, as shown in 3e. A conventional CMP operation may be used to polish back the trench fill metal, and underlying materials. Process steps for completing the device are omitted, as they are well known to those skilled in the art.

In the embodiment represented by FIGS. 3a-3e, if first metal layer 116 is n-type, then second metal layer 135 is p-type. If first metal layer 116 is p-type, then second metal layer 135 is n-type. In the resulting device, P/N junction 124 resides where first metal layer 116 meets second metal layer 135. In devices with the FIG. 3e structure, an adjacent trench (e.g., trench 114 of FIGS. 1a-1i—not shown in FIG. 3e) may have a P/N junction with the reverse orientation. Within such an adjacent trench, second metal layer 135 may contact high-k gate dielectric layer 115 where first metal layer 116 contacts that dielectric layer in FIG. 3e, while first metal layer 116 may contact high-k gate dielectric layer 115 where second metal layer 135 contacts that dielectric layer in FIG. 3e.

Although the embodiment of FIGS. 3a-3e illustrates a method for forming a structure with a P/N junction, other embodiments may form devices that do not include a P/N junction. For example, in other devices, first metal layer 116, shown in FIG. 1i, may coat trench 114 along its entire width, while second metal layer 135, shown in FIG. 1i, coats trench 113 along its entire width. The method of the present invention is thus not limited to forming devices with P/N junctions.

It follows that the aforementioned second part of the aforementioned second dielectric layer may be formed within a second trench, which differs from a first trench that receives a first part of the second dielectric layer, or instead may be formed within the same trench that receives a first part of the second dielectric layer. In the illustrated embodiments, the second dielectric layer, which may comprise a high-k gate dielectric layer, is formed after forming the first dielectric layer. In alternative embodiments, such a second dielectric layer may be formed before forming the first dielectric layer.

FIGS. 4a-4e represent cross-sections of structures that may be formed when carrying out a second embodiment of the method of the present invention. In this second embodiment, after forming a structure like the one FIG. 1c illustrates, donor metal layer 420 is deposited on first metal layer 416—generating the structure illustrated by FIG. 4a. Donor metal layer 420 comprises a workfunction shifting component. If first metal layer 416 comprises an n-type metal, then donor metal layer 420 may comprise ruthenium, palladium, platinum, iridium, various refractory metal nitrides (e.g., tungsten nitride or tantalum nitride), or alloys or compounds that include one or more of those materials. If first metal layer 416 comprises a p-type metal, then donor metal layer 420 may comprise hafnium, zirconium, titanium, aluminum, lanthanum, or alloys or compounds that include one or more of those materials.

Although a few examples of materials that may be used to form donor metal layer 420 are described here, that layer may be made from many other materials. Donor metal layer 420 may be formed on first metal layer 416 using a conventional PVD or CVD process, preferably is between about 25 angstroms and about 300 angstroms thick, and more preferably is between about 25 angstroms and about 200 angstroms thick.

Figure 4A:
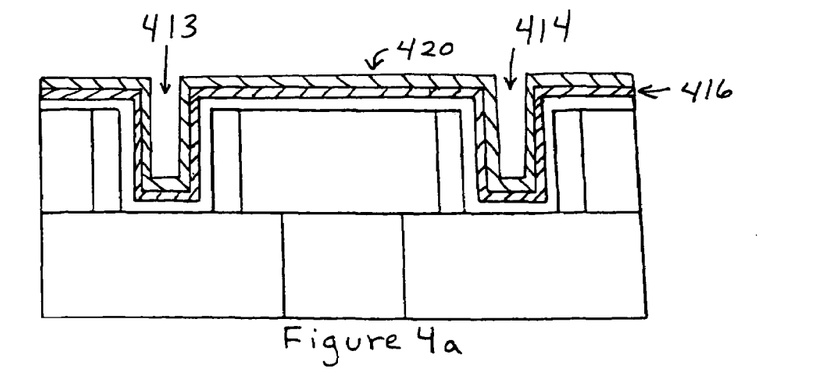
FIGS. 4a-4e represent cross-sections of structures that may be formed when carrying out a second embodiment of the method of the present invention.
Figure 4B:
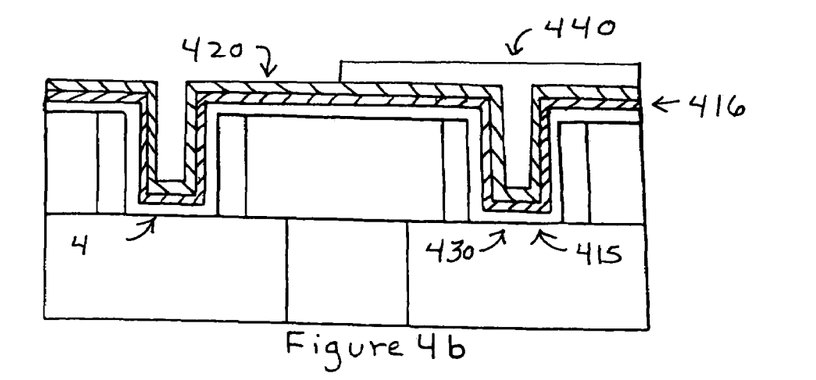
Figure 4C:
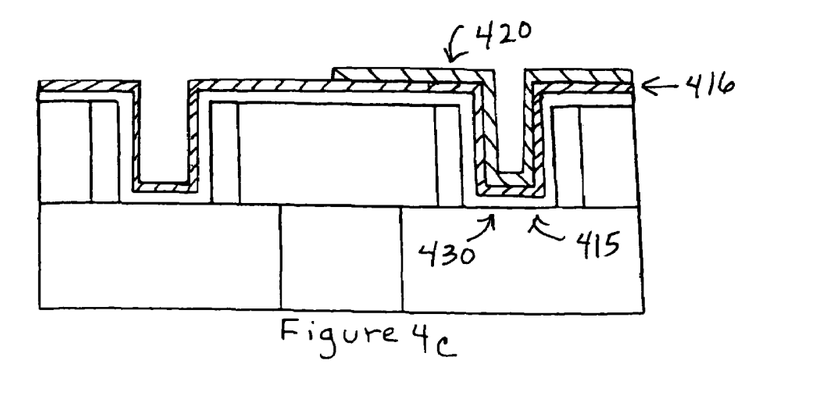

After depositing donor metal layer 420 on first metal layer 416, masking layer 440 is formed on donor metal layer 420, where deposited on first metal layer 416 above first part 430 of high-k gate dielectric layer 415. Masking layer 440 may comprise an SOG or SOP based sacrificial light absorbing material, or another conventional masking material. Masking layer 440 may be deposited and patterned to generate the FIG. 4b structure using conventional process steps. The exposed part of donor metal layer 420 may then be removed, e.g., via an appropriate etch operation, followed by removing masking layer 440, as FIG. 4c illustrates.

Figure 4D:
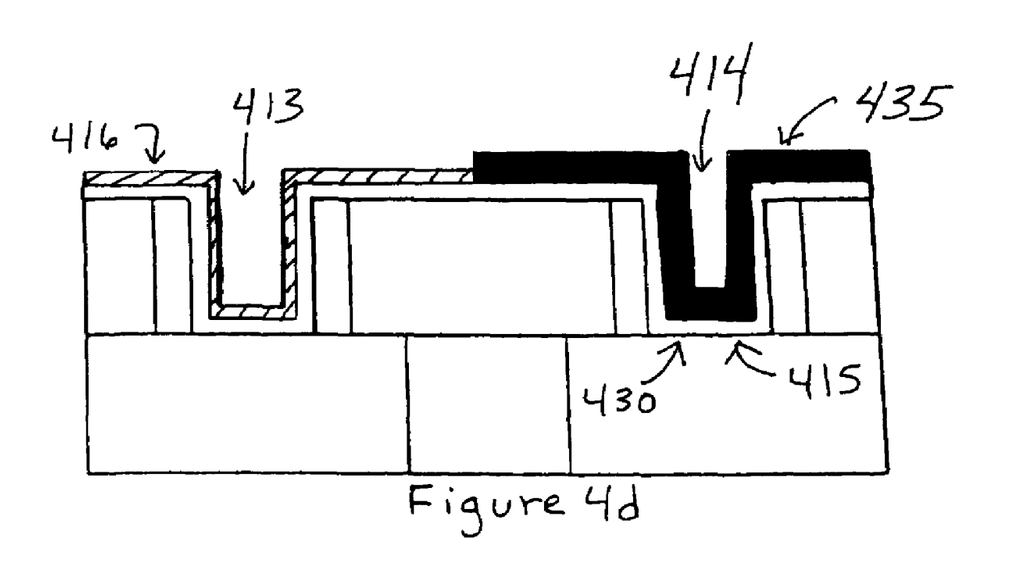
Figure 4E:
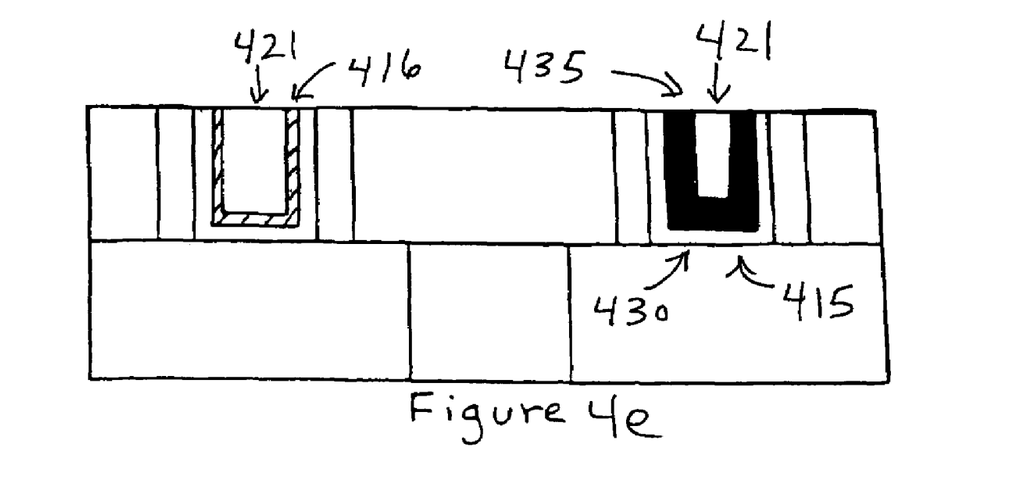

A high temperature anneal is then applied to convert first metal layer 416, where formed on first part 430 of high-k gate dielectric layer 415, into second metal layer 435, generating the FIG. 4d structure. A rapid thermal anneal ("RTA"), i.e., an anneal process in which the temperature ramp up and ramp down times are relatively short, may suffice. In a preferred embodiment, such an RTA process should take place at between about 300° C. and about 600° C. in an inert ambient or under vacuum. Although an RTA process may be preferred, in alternative embodiments a high temperature anneal that takes place for between about 1 minute and about 2 hours may be performed.

The appropriate time, temperature, and other operating conditions under which the high temperature anneal takes place may depend upon the nature of first metal layer 416 and donor metal layer 420. The desired result may also depend upon the nature of those metal layers. If, for example, first metal layer 416 comprises an n-type metal, then the anneal should be applied under conditions that convert part of that n-type metal layer into a p-type metal layer with a workfunction of between about 4.9 and about 5.2. If instead first metal layer 416 comprises a p-type metal, then the anneal should be applied under conditions that convert part of that p-type metal layer into an n-type metal layer with a workfunction of between about 3.9 and about 4.2.

After converting part of first metal layer 416 into second metal layer 435, fill metal 421 may be deposited onto first metal layer 416 and second metal layer 435. Portions of fill metal 421, second metal layer 435, first metal layer 416, and high-k gate dielectric layer 415 are then removed, except where they fill the trench, generating the FIG. 4e structure. Process steps for completing the device are omitted, as they are well known to those skilled in the art. Like the embodiment of FIGS. 1a-1i, first metal layer 416 of FIG. 4e may coat trench 413 along its entire width, while second metal layer 435 of FIG. 4e coats trench 414 along its entire width. Alternatively, the embodiment of FIGS. 4a-4e may be used to form a structure with a P/N junction, like the structure of FIG. 3e.

As illustrated above, the method of the present invention enables production of CMOS devices that include a high-k gate dielectric layer and metal gate electrodes with appropriate workfunctions for both NMOS and PMOS transistors. This method may enable a replacement gate process to generate such a CMOS device without requiring removal of part of a metal gate layer from an underlying high-k gate dielectric layer. As a result, the process of the present invention may prevent such a removal step from damaging the high-k gate dielectric layer. Although the embodiments described above provide examples of processes for forming CMOS devices that may benefit from application of the present invention, the present invention is not limited to these particular embodiments.

Although the foregoing description has specified certain steps and materials that may be used in the present invention, those skilled in the art will appreciate that many modifications and substitutions may be made. Accordingly, all such modifications, alterations, substitutions and additions fall within the spirit and scope of the invention as defined by the appended claims.

What is claimed is:

1. A method for making a semiconductor device comprising:
   forming a first dielectric layer on a substrate;
   forming a trench within the first dielectric layer;
   forming a second dielectric layer on the substrate, the second dielectric layer having a first part that is formed at the bottom of the trench and a second part;
   forming a first metal layer having a first workfunction on the first part of the second dielectric layer and on the second part of the second dielectric layer; and
   converting the first metal layer, where formed on the first part of the second dielectric layer, into a second metal layer with a second workfunction by:
      masking the first metal layer with a sacrificial light absorbing material;
      forming a photoresist layer on the sacrificial light absorbing material;
      patterning the photoresist layer such that a first portion of the sacrificial light absorbing material may subsequently be removed;
      removing the first portion of the sacrificial light absorbing material, which first portion overlies the first part of the second dielectric layer, while leaving a second portion of the sacrificial light absorbing material overlying the second part of the second dielectric layer; and
      adding a workfunction shifting component to the first metal layer, where formed on the first part of the second dielectric layer,
   wherein:
      the sacrificial light absorbing material includes a light absorbing dye that absorbs light at a wavelength used in the patterning of the photoresist layer.

2. The method of claim 1 wherein the second dielectric layer comprises a high-k gate dielectric layer that is formed on the substrate after the first dielectric layer is formed on the substrate.

3. The method of claim 2 wherein the high-k gate dielectric layer comprises a material that is selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

4. The method of claim 1 wherein the first metal layer comprises a material that is selected from the group consisting of hafnium, zirconium, titanium, tantalum, aluminum, a metal carbide, an aluminide, ruthenium, palladium, platinum, cobalt, nickel, and a conductive metal oxide.

5. The method of claim 1 wherein the workfunction shifting component is added to the first metal layer by exposing the first metal layer to a fluorine based plasma.

6. The method of claim 5 wherein the first metal layer, where formed on the first part of the second dielectric layer, is converted into a second metal layer with a second workfunction by:
   treating the first metal layer, where formed on the first part of the second dielectric layer, to a plasma derived at least in part from sulfur hexafluoride; then
   removing the second portion of the sacrificial light absorbing material.

7. The method of claim 1 wherein the first metal layer, where formed on the first part of the second dielectric layer, is converted into a second metal layer with a second workfunction by:
   forming a donor metal layer, which comprises a workfunction shifting component, on the first metal layer where formed on the first part of the second dielectric layer; then
   applying a high temperature anneal treatment to cause the workfunction shifting component to diffuse from the donor metal layer into the first metal layer.

8. The method of claim 7 further comprising:
   depositing the donor metal layer on the first metal layer;
   forming a masking layer on the donor metal layer, where deposited on the first metal layer above the first part of the second dielectric layer;
   removing the exposed part of the donor metal layer, where deposited on the first metal layer above the second part of the second dielectric layer;
   removing the masking layer; and
   applying the high temperature anneal treatment; and
   wherein:
      the donor metal layer comprises a material that is selected from the group consisting of ruthenium, palladium, platinum, iridium, a refractory metal nitride, hafnium, zirconium, titanium, aluminum, and lanthanum; and
      the high temperature anneal takes place at a temperature of at least about 300° C. for at least about one minute to generate the second metal layer with the second workfunction.

9. The method of claim 1 wherein the first metal layer is between about 25 and about 300 angstroms thick, and has a workfunction that is between about 3.9 eV and about 4.2 eV, and the second metal layer has a workfunction that is between about 4.9 eV and about 5.2 eV.

10. The method of claim 1 wherein the first metal layer is between about 25 and about 300 angstroms thick, and has a workfunction that is between about 4.9 eV and about 5.2 eV, and the second metal layer has a workfunction that is between about 3.9 eV and about 4.2 eV.

11. The method of claim 1 wherein the second dielectric layer is formed on the substrate before the first dielectric layer is formed on the substrate, and wherein the second part of the second dielectric layer, like the first part of the second dielectric layer, is formed at the bottom of the trench.

12. The method of claim 1 wherein the second part of the second dielectric layer is formed at the bottom of a second trench that is formed within the first dielectric layer.

13. A method for making a semiconductor device comprising:
   forming a first dielectric layer on a substrate;
   forming a trench within the first dielectric layer;
   forming a high-k gate dielectric layer on the substrate, the high-k gate dielectric layer having a first part that is formed at the bottom of the trench and a second part;
   forming a first metal layer on both the first and second parts of the high-k gate dielectric layer, the first metal layer having a first workfunction;
   forming a sacrificial light absorbing material on the first metal layer, a first part of the sacrificial light absorbing material covering the first part of the high-k gate dielectric layer and a second part of the sacrificial light absorbing material covering a second part of the high-k gate dielectric layer;
   removing the first part of the sacrificial light absorbing material while retaining the second part of the sacrificial light absorbing material, thus exposing part of the first metal layer, the removal of the first part of the sacrificial light absorbing material being accomplished using a patterned photoresist layer;
   converting the exposed part of the first metal layer into a second metal layer with a second workfunction; and
   removing the second part of the sacrificial light absorbing material, wherein the sacrificial light absorbing material includes a light absorbing dye that absorbs light at a wavelength used in the patterning of the photoresist layer.

14. The method of claim 13 wherein the exposed part of the first metal layer is converted into the second metal layer with the second workfunction by treating the exposed part of the first metal layer with a fluorine based plasma.

15. The method of claim 14 wherein the first metal layer is between about 25 and about 300 angstroms thick, has a workfunction that is between about 3.9 eV and about 4.2 eV, and comprises a material that is selected from the group consisting of hafnium, zirconium, titanium, tantalum, aluminum, a metal carbide, and an aluminide, and the second metal layer has a workfunction that is between about 4.9 eV and about 5.2 eV.

* * * * *